United States Patent
Ledentsov

(10) Patent No.: US 8,472,496 B2
(45) Date of Patent: Jun. 25, 2013

(54) OPTOELECTRONIC DEVICE AND METHOD OF MAKING SAME

(75) Inventor: Nikolay Ledentsov, Berlin (DE)

(73) Assignee: VI Systems GmbH, Berlin (DE)

( * ) Notice: Subject to any disclaimer, the term of this patent is extended or adjusted under 35 U.S.C. 154(b) by 339 days.

(21) Appl. No.: 12/803,747

(22) Filed: Jul. 6, 2010

(65) Prior Publication Data

US 2011/0007764 A1    Jan. 13, 2011

Related U.S. Application Data

(60) Provisional application No. 61/270,361, filed on Jul. 8, 2009.

(51) Int. Cl.
*H01S 5/00* (2006.01)
*H01S 3/08* (2006.01)

(52) U.S. Cl.
USPC .............. 372/50.124; 372/43.01; 372/98; 372/99

(58) Field of Classification Search
USPC ............ 372/50.1–50.124, 43.01, 98–99, 372/45.01
See application file for complete search history.

(56) References Cited

U.S. PATENT DOCUMENTS

| | | | | |
|---|---|---|---|---|
| 2005/0281308 | A1* | 12/2005 | Kim | 372/70 |
| 2007/0291808 | A1* | 12/2007 | Ledentsov et al. | 372/50.11 |
| 2008/0175292 | A1* | 7/2008 | Sheik-Bahae | 372/45.01 |

* cited by examiner

*Primary Examiner* — Jessica Stultz
*Assistant Examiner* — Phillip Nguyen

(57) ABSTRACT

A device representing a reflector, for example, an evanescent reflector or a multilayer interference reflector with at least one reflectivity stopband is disclosed. A medium with means of generating optical gain is introduced into the layer or several layers of the reflector. The optical gain spectrum preferably overlaps with the spectral range of the reflectivity stopband. This device can be attached to air, semiconductor or dielectric material or multilayer structures and provide a tool for preferential amplification of the optical waves propagating at larger angles with respect to the interface with the evanescent or the multilayer interference reflector. Thus angle selective amplification or generation of light is possible. Several evanescent or interference reflectors can be used to serve the goal of preferable amplification the said optical waves.

15 Claims, 9 Drawing Sheets

OPTOELECTRONIC DEVICE AND METHOD OF MAKING SAME

This application claims the benefit of U.S. Provisional Application No. 61/270,361, filed Jul. 8, 2009.

BACKGROUND OF THE INVENTION

1. Field of the Invention

The invention pertains to the field of optoelectronic devices. More particularly, the invention pertains to semiconductor light emitting devices.

2. Description of Related Art

There is a need in the light sources providing a highly directional emission of photons. Furthermore, in many cases there is a need that the emission amplified is perpendicular to the surface of the device, or has the strongest component of the k-vector in this direction. However, in most of the cases the gain medium emits photons in a broad range of angles. A good overview of the problem can be found in *High Power Diode Lasers: Fundamentals, Technology, Applications*; R. Diehl, ed., Springer, Berlin (2000).

To counteract this effect several approaches were introduced. In light-emitting diodes photonic crystal structures surrounding the light-emitting medium can be introduced. These structures can suppress light emission in certain directions in the angle space, while enhance the light emission in the other directions. This concept can be used also in lasers, including laser diodes. Some examples of this approach include U.S. Pat. No. 6,704,343, entitled "HIGH POWER SINGLE MODE VERTICAL CAVITY SURFACE EMITTING LASER", issued Mar. 9, 2004, and U.S. Pat. No. 6,810,056, entitled "SINGLE MODE VERTICAL CAVITY SURFACE EMITTING LASER USING PHOTONIC CRYSTALS WITH A CENTRAL DEFECT", issued Oct. 26, 2004.

In lasers the directionality can be also improved by choosing a proper resonator providing a feedback only for the appropriate direction. However, generally, the resonator may also provide feedback for many optical modes within a certain angle space resulting in multimode light emission. In edge-emitting lasers, the angle spread is defined by the appearance of several transverse modes due to the large lateral or vertical size of the light-emitting aperture. The spacing between the longitudinal modes is very small in edge emitting lasers and the wavelength range of the different transverse lobes overlap. However, in single longitudinal mode edge emitting lasers such as distributed feedback lasers, appearance of different transverse modes also results in the evolution of several emission lines in the wavelength space. In vertical cavity surface emitting lasers with a significantly large light-emitting aperture (typically beyond 1 micrometer in diameter), the spread of the emission in the angle and the wavelength space are interconnected and defined by the appearance of high order transverse modes with emission tilted with respect to the normal to the interfaces in the device for the same longitudinal mode. In single mode devices having a small aperture, only one optical mode may be supported and the lasing occurs then in a single mode. However, also in this case the spread of the emission in the angle space is broadened due to the light diffraction effect at the small output aperture. Thus, also in this case, the angle component of emission, which is directed close to the normal to the surface of the device, may contribute to only a small fraction of the emission within the total diffraction-defined emission angle. In optical amplifiers stimulated emission may occur in all the directions defined by the light waveguiding structure. Even when a single mode single wavelength emission is coupled to the amplifier, several modes may be excited in the waveguide causing an angle spread at the exit of the device. When the waveguide supports only a single transverse mode the angle spread will be significant due to the light diffraction effect at the output aperture. Thus, to get a highly directional emission one may need to preferably amplify the optical emission in the preferable direction, in the case under consideration in the direction perpendicular to the interfaces in the multilayer structure or in the direction, which is the close to this perpendicular direction.

SUMMARY OF THE INVENTION

A device representing a reflector, for example, an evanescent reflector or a multilayer interference reflector with at least one reflectivity stopband is disclosed. A medium with means of generating optical gain is introduced into the layer or several layers of the reflector. The optical gain spectrum preferably overlaps with the spectral range of the reflectivity stopband. This device can be attached to air, semiconductor or dielectric material or multilayer structures and provide a tool for preferential amplification of the optical waves propagating at larger angles with respect to the interface with the evanescent or the multilayer interference reflector. Thus angle selective amplification or generation of light is possible. Several evanescent or interference reflectors can be used to serve the goal of preferable amplification the said optical waves. The selective amplification of the emission occurs due to the fact that the optical waves having a larger angle with the reflector surface can propagate deeper into the reflector and be efficiently amplified by the gain medium incorporated into the reflector. As opposite the optical waves coming at the small angles with respect to the reflector surface or interface can only weakly propagate inside the reflector and the amplification of these waves can be made arbitrarily small. The preferably amplified emission can be partially or fully reflected back in the proposed device composed of an evanescent reflector or a multilayer structure. Thus, a feedback mechanism may be established allowing stimulated emission or lasing only in the selected direction in spite of the fact that many optical modes with different characteristic emission angles may exist in the device.

DETAILED DESCRIPTION OF THE INVENTION

Figure 1:
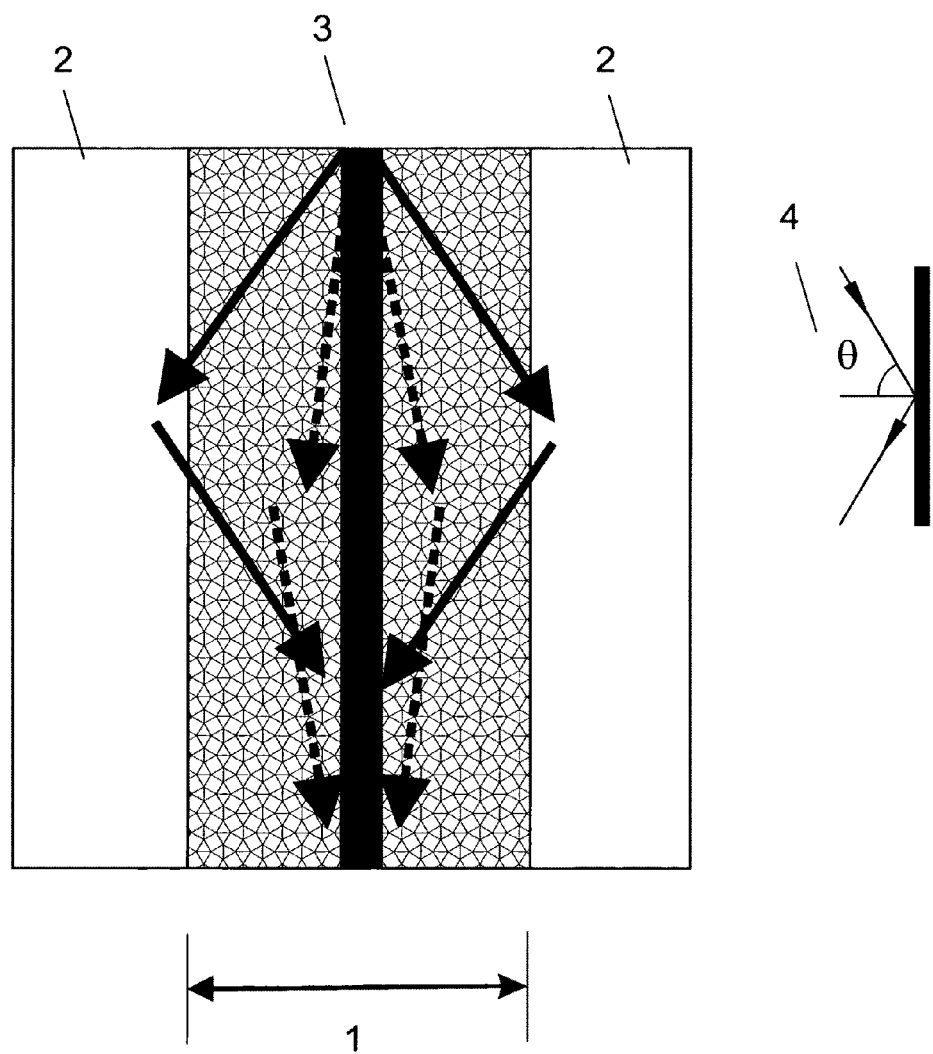
FIG. 1 shows a schematic representation of the prior art device. A layer composed of certain medium is clad in one or both sides by reflectors, for example, evanescent reflectors composed of layers having a lower refractive index as compared to the medium. A gain region is introduced inside the medium. The geometrical dimensions of the medium region are large enough to support several optical modes at different effective mode angles. All the optical waves may have a significant overlap with the gain region and be amplified.

A schematic representation of the prior art device is shown in FIG. 1. It represents a medium (1) placed in the waveguide region confined at least on one side by a reflector region (2). A layer composed of a certain medium (1) can be clad, for example, by evanescent reflectors (2) composed of layers having a lower refractive index as compared to the medium. A gain region (3) is introduced inside the medium may interact with different optical waves existing in the device once the geometrical dimensions of the medium region is large enough to support several optical modes at different effective mode angles. Unless the gain medium has a particular width and specially placed with respect to one or another waveguide mode, all the optical modes may have a significant overlap with the gain region and be amplified.

Figure 2:
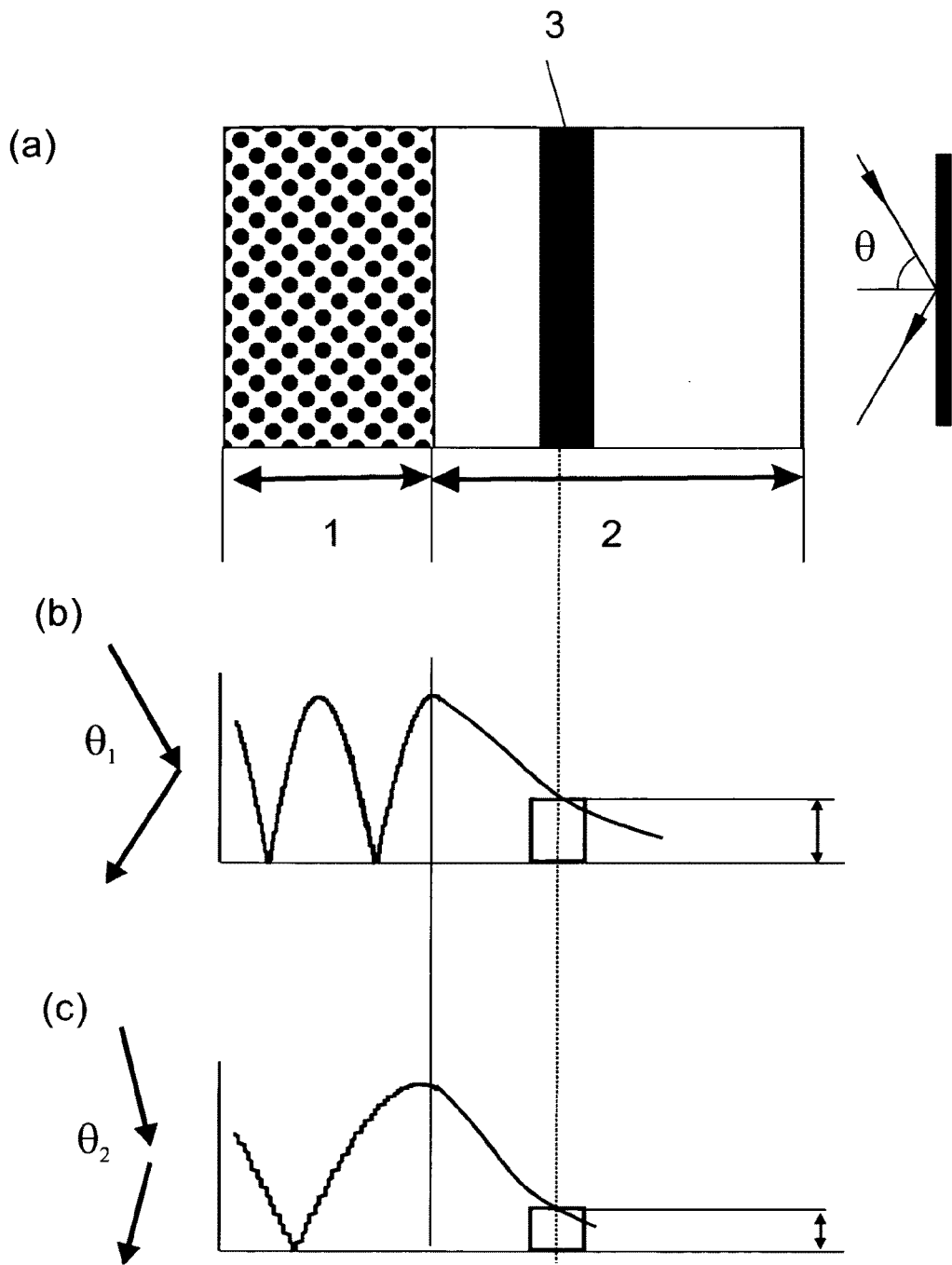
FIG. 2 shows a case when the gain medium is incorporated into the layer of the evanescent reflector. The optical waves propagating within the medium partially penetrate into the reflector region. Furthermore, the modes coming at smaller angles with respect to the normal to the interface (b), propagate deeper into the reflector layer and thus stronger interact with the gain medium, as compared to the modes propagating at larger angles (b). Thus the optical waves coming at smaller angles with respect to the normal to the interface are predominantly amplified.

In the device proposed in the present invention, which is schematically represented in FIG. 2 (a) the gain medium (3) is incorporated deeply into the layer of the evanescent reflector. The optical waves propagate within the medium attached to the reflector and partially penetrate into the reflector region. Furthermore, the modes coming at smaller angles θ with respect to the normal to the interface (b), propagate deeper into the reflector layer and thus stronger interact with the gain medium, as compared to the modes propagating at larger angles (b). Thus the optical waves coming at smaller angles with respect to the normal to the interface are predominantly amplified.

Different semiconductor or dielectric materials can be used. Also multilayer evanescent reflectors made of composite dielectric-semiconductor multilayer materials can be applied. The gain medium (3) can be preferably introduced in the semiconductor part of the evanescent reflector (2) to allow current injection. On the opposite side of the waveguide medium with respect to the gain region also metal reflectors can be applied.

Different surface and/or interface one-two or three-dimensional patterns may be introduced into the waveguide medium or cladding regions to add necessary functionality, unless these patterns do not hinder the angle-selective amplification or generation of the optical waves.

Figure 3:
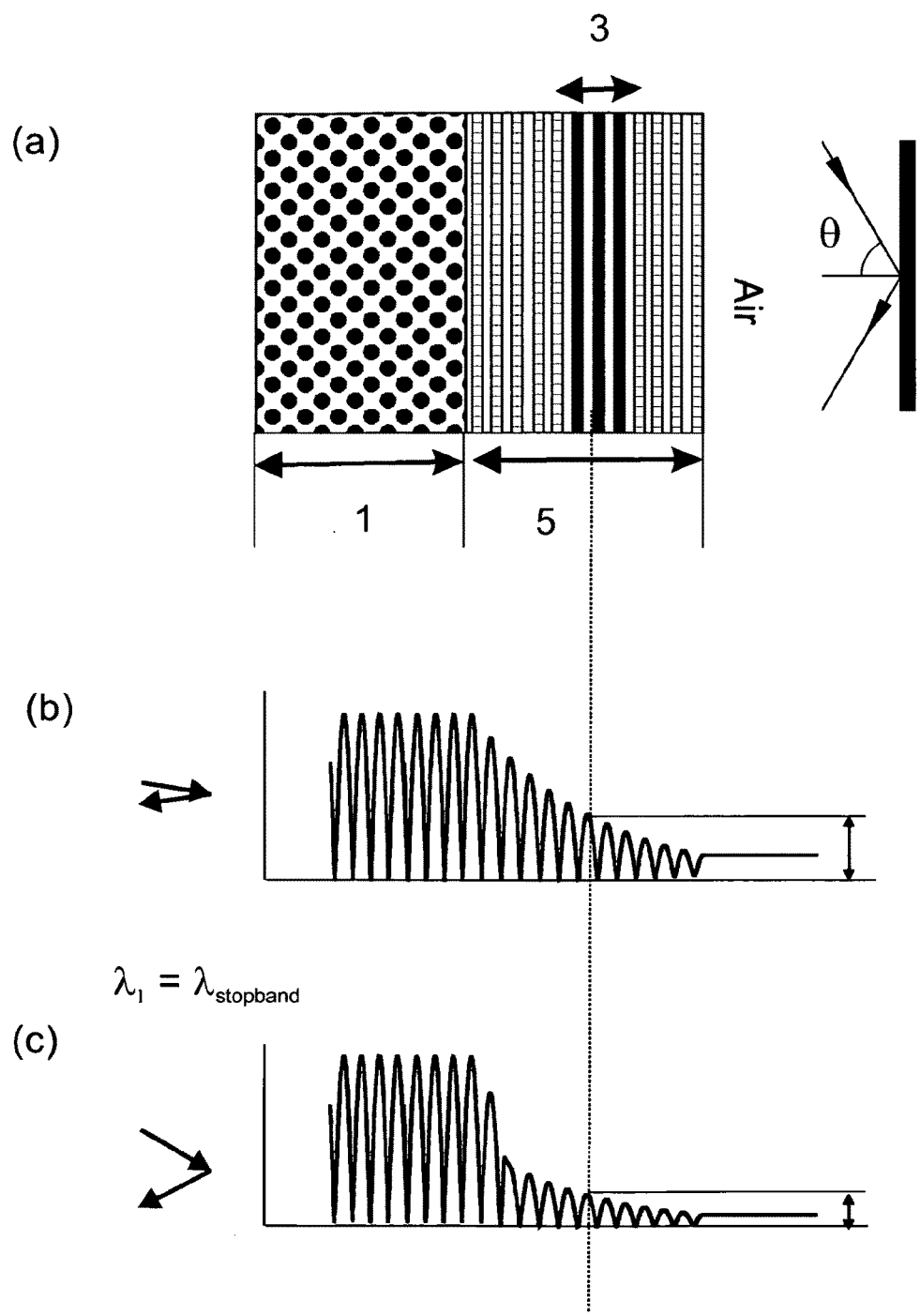
FIG. 3 (a) shows a case when the gain medium is incorporated deeply into the region of the multilayer interference reflector, for example, distributed Bragg reflector (DBR). The optical waves at wavelengths corresponding to the DBR wavelength at a given angle partially penetrate into the reflector region. Optical reflectance spectra for DBR with a refractive index step between the layers of 0.2 at different angles are shown in FIG. 3b. The averaged refractive index difference between the medium and the DBR is ~0.1. The modes coming at smaller angles with respect to the normal to the interface (b), propagate deeper into the DBR, as the reflectivity is low, and thus stronger interact with the gain medium, as compared to the modes propagating at larger angles (b). Thus the optical waves coming at smaller angles with respect to the normal to the interfaces are predominantly amplified.

In another embodiment presented in FIG. 3 (a) a case when the gain medium is incorporated into the region of the multilayer interference reflector, for example, distributed Bragg reflector (DBR) is disclosed. The optical waves at the wavelengths corresponding to the DBR wavelength at a given angle can penetrate into the reflector region. Furthermore, the modes coming at smaller angles with respect to the normal to the interface (b), can propagate deeper into the DBR (5) and thus stronger interact with the gain medium, as compared to the modes propagating at larger angles (b). Thus the optical waves coming at smaller angles with respect to the normal to the interfaces can be predominantly amplified.

In the case when the device contains a waveguide region confined in the direction perpendicular to the interfaces by two reflectors, for example by two DBRs, or by one DBR and one evanescent reflector, or by one DBR and one metal reflector, vertical (longitudinal) modes appear. For the same longitudinal mode several transverse modes can exist in case when the lateral dimensions of the waveguide are large enough. In this case each transverse mode will have its own wavelength and the larger the effective angle of the transverse mode the shorter the wavelength of the mode will be. Thus, each transverse mode will interact with DBRs at a given angle and wavelength.

Figure 4:
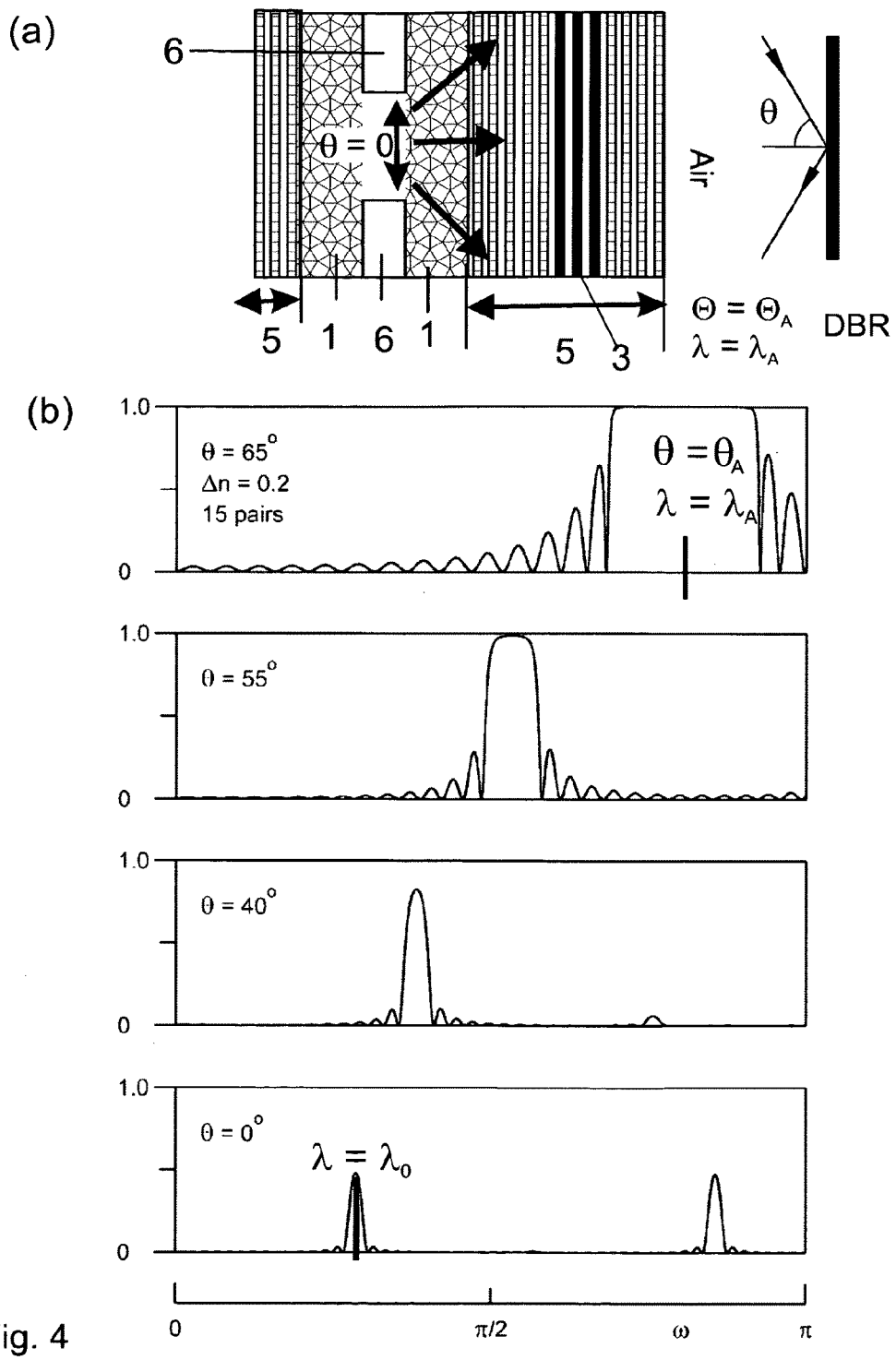
FIG. 4 (a) shows a passive or active optical cavity attached to DBR with inserted gain regions. The cavity is laterally confined by the regions with lower refractive index. Several optical modes at different wavelengths exist in the cavity each having its own emission pattern in the angle space. The reflectivity of the DBR is lower at the smaller angles (b) with respect to the normal to the interface. The optical modes having emission pattern at predominantly small angles propagate deeper into the reflector (DBR) region, where these modes can be amplified. For the modes propagating at large angles the reflectivity of the DBR is very high (b, 65 degrees) and the interaction with the gain medium is negligible.
Figure 6:
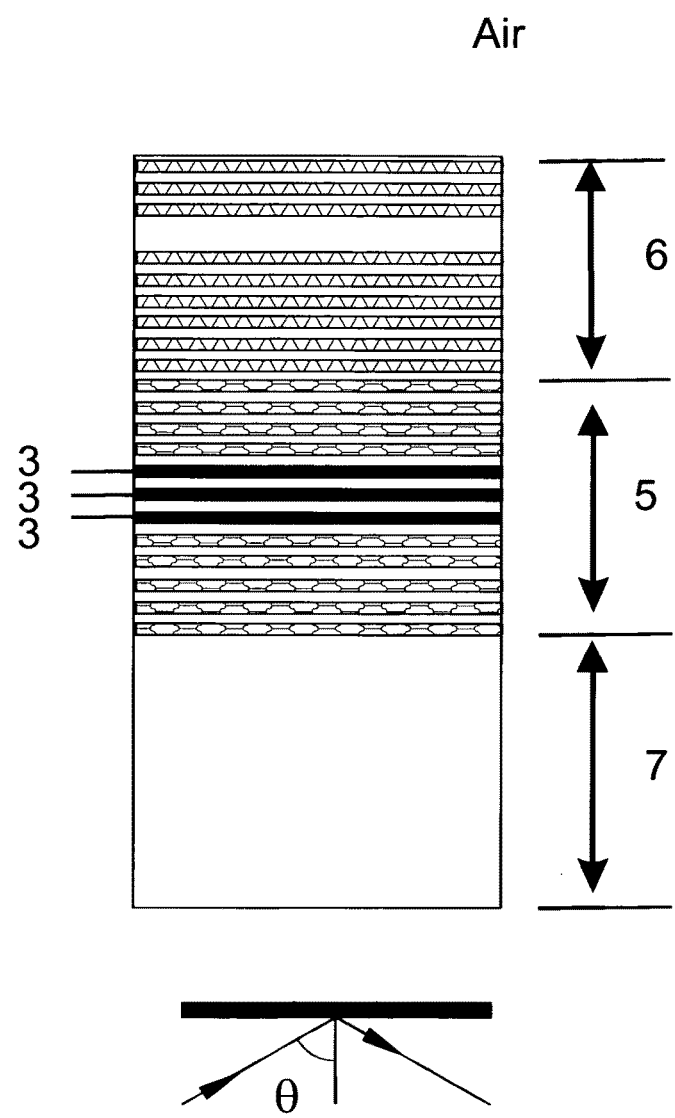
FIG. 6 shows a case when the multilayer interference reflector region composed of semiconductor layers (for example, DBR), which contain gain regions incorporated into the λ/4 DBR layers having alternating refractive indices, is attached to a passive vertical optical cavity composed of a dielectric layer confined by dielectric DBR.

A passive or active optical cavity attached to DBR with inserted gain regions is shown schematically in FIG. 4 (a). The cavity is laterally confined by the regions with lower refractive index (6) as shown in FIG. 6. Several transverse optical modes at different wavelengths exist in the cavity each having its own emission pattern in the angle space. The reflectivity of the DBR presented in FIG. 4(b) is lower at smaller angles with respect to the normal to the interface. The optical modes having emission pattern at predominantly small angles propagate deeper into the reflector (DBR) region, where these modes can be amplified. For the high order modes having a shorter wavelength and propagating at large angles the reflectivity of the DBR can be very high (see FIG. 3b the reflectivity spectrum for 65 degrees) and the propagating length into the DBR very low. Thus, the interaction with the gain medium can be made negligible. Any type of multilayer interference reflector can be applied unless the described condition is fulfilled.

Figure 5:
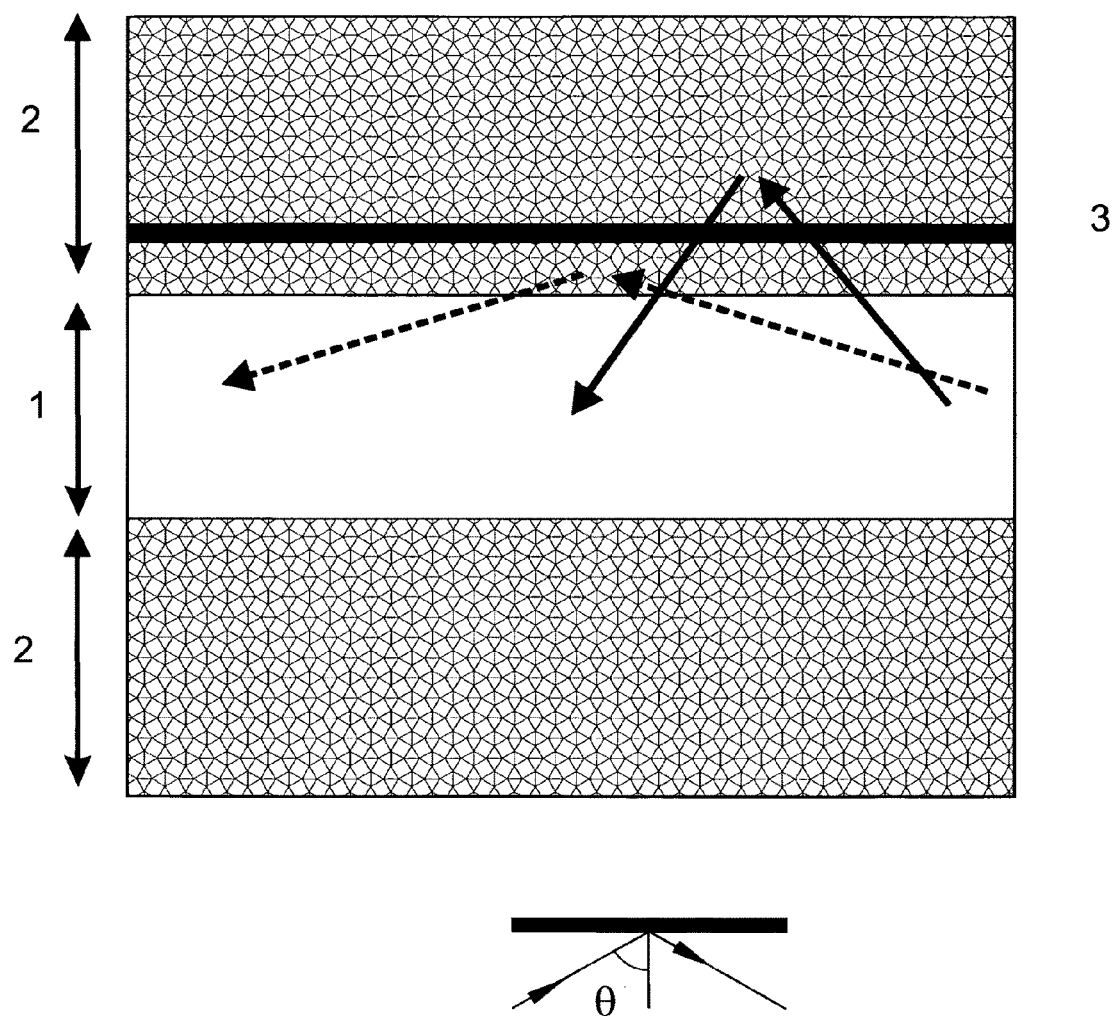
FIG. 5 schematically shows a waveguide region, which is supporting different modes propagating at different angles. The modes coming at smaller angles with respect to the normal to the interface (solid line), propagate deeper into the evanescent reflector and thus stronger interact with the gain medium, as compared to the modes propagating at larger angles (dashed line).

In another case the angle selective optical waveguide can be represented by a layer or a wire clad by evanescent or multilayer reflectors as it is shown schematically in FIG. 5. The waveguide region, is supporting different modes propagating at different angles even the longitudinal path of the optical wave is large. The modes coming at smaller angles with respect to the normal to the interface (solid line), propagate deeper into the evanescent reflector and thus stronger interact with the gain medium, as compared to the modes propagating at larger angles (dashed line). Thus, in case the waveguide contains a finite number of transverse modes, high-order modes with a smaller angle with respect to the normal to the interfaces will be preferably amplified.

Different embodiments can be addressed. A case when the multilayer interference reflector (MIR) region composed of semiconductor layers is attached to a dielectric passive vertical cavity (6) is shown in FIG. 6. MIR may represent semiconductor DBR containing gain regions incorporated into the λ/4 DBR layers having alternating refractive indices formed on semiconductor substrate (7). The gain medium (3) incorporated into the DBR (5) may excite optical modes inside the passive dielectric cavity, which may act as a virtual source of light, even the real generation of light takes place geometrically away from the said passive optical cavity.

Figure 7:
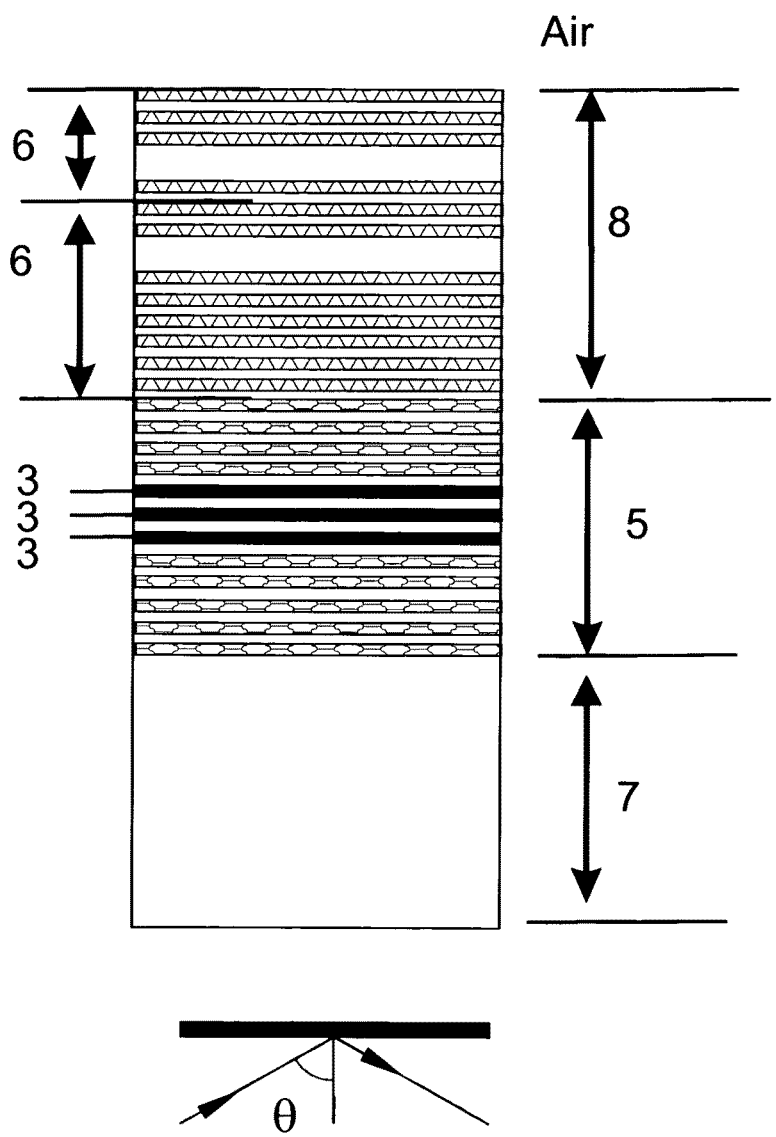
FIG. 7 shows a case when the multilayer interference reflector region composed of semiconductor layers (for example, DBR), is attached to a passive coupled vertical optical cavity composed of two dielectric vertical cavity layers confined by dielectric DBRs. Gain regions are incorporated into the λ/4 DBR layers of the semiconductor DBR. The modes coming at smaller angles with respect to the normal to the interface, propagate deeper into the DBR reflector and thus stronger interact with the gain medium, as compared to the modes propagating at larger angles. Two vertical modes can be amplified and predominantly the lateral modes having a small angle with respect to the normal to the interfaces will be amplified for both components. More dielectric cavities may be vertically stacked.

Further important amendments can be made. A case when the multilayer interference reflector region composed of semiconductor layers (for example, DBR), is attached to a passive coupled vertical optical cavity (8) composed of two dielectric vertical cavity layers confined by dielectric DBRs is shown in FIG. 7. Gain regions are incorporated into the λ/4 DBR layers of the semiconductor DBR (5). The modes coming at smaller angles with respect to the normal to the interface, propagate deeper into the DBR reflector and thus stronger interact with the gain medium, as compared to the modes propagating at larger angles. Two vertical modes can be amplified and predominantly the lateral modes having a small angle with respect to the normal to the interfaces will be amplified for both components. Also three or more dielectric cavities may be vertically stacked and the angle-preferential amplification of the related optical modes will be maintained.

An additional functionality, similarly to typically utilized to other semiconductor devices, can be applied for structures with angle selective amplification of optical emission. This may include, for example, but not limited to, regions with electro-absorptive or electro-refractive regions. Mode-locked and self-pulsating devices with angle-selective emission can be fabricated.

Figure 8:
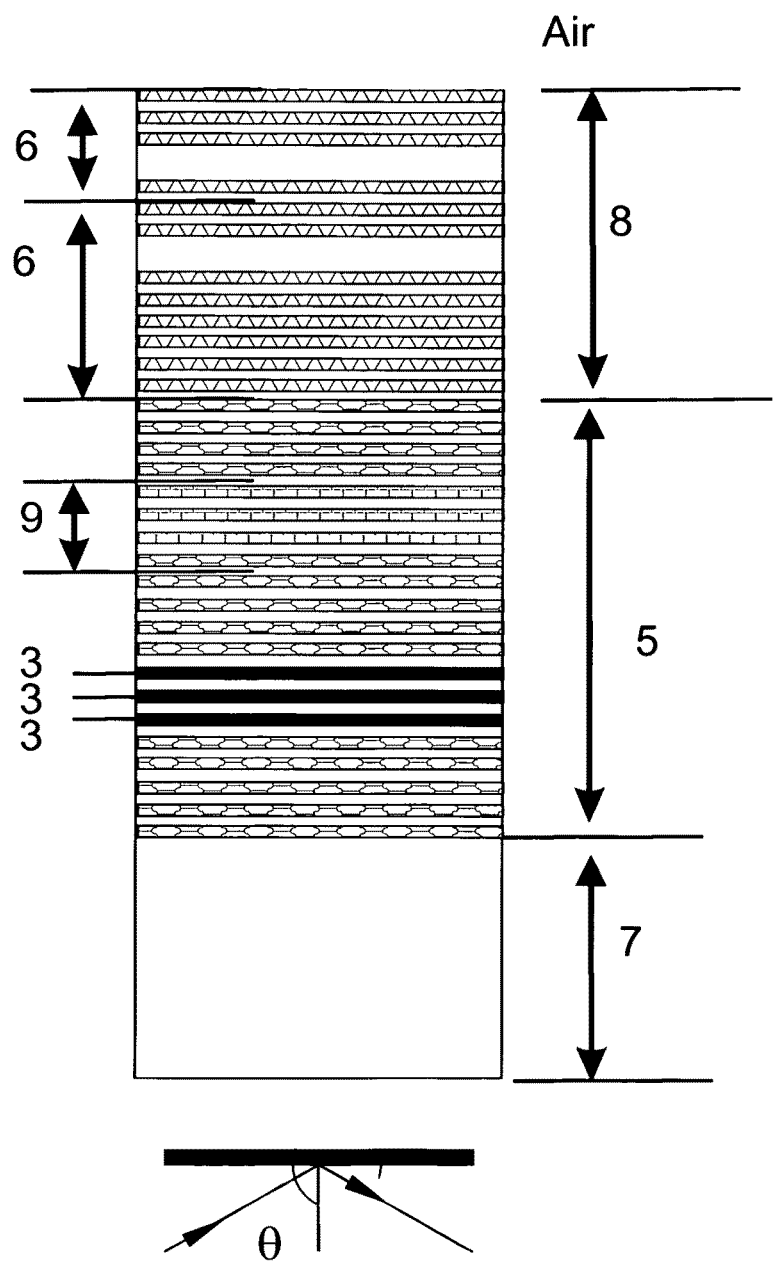
FIG. 8 shows a case when the multilayer interference reflector region composed of semiconductor layers (for example, DBR), is attached to a passive coupled vertical optical cavity composed of two dielectric vertical cavity layers confined by dielectric DBRs. Gain regions are incorporated into the λ/4 DBR layers of the semiconductor DBR. Furthermore, regions with electro-optically active medium are introduced into the same semiconductor DBR. The modes coming at smaller angles with respect to the normal to the interface propagate deeper into the DBR reflector and thus have a stronger interaction with the gain medium, as compared to the modes propagating at larger angles. Using the elecrooptically-active medium introduced in the DBR one can change the refractive index of the region where these angle-selectively amplified modes have a significant intensity. Now the vertically coupled modes having a small angle with respect to the normal to the interfaces can be modulated in wavelength and (or) intensity using electrooptic modulation.

An example of such a device is presented in FIG. 8, which shows a case when the multilayer interference reflector region composed of semiconductor layers (for example, DBR), is attached to a passive coupled vertical optical cavity composed of two dielectric vertical cavity layers confined by dielectric DBRs. Gain regions are incorporated into the λ/4 DBR layers of the semiconductor DBR. Furthermore, regions with electro-optically active medium are introduced into the same semiconductor DBR. The modes coming at smaller angles with respect to the normal to the interface propagate deeper into the DBR reflector and thus have a stronger interaction with the gain medium, as compared to the modes propagating at larger angles. Using the elecrooptically-active medium (9) introduced in the DBR one can change the refractive index of the region, where these angle-selectively amplified modes have a significant intensity. Now the vertically coupled modes having a small angle with respect to the normal to the interfaces can be modulated in wavelength and (or) intensity using electrooptic modulation.

Figure 9:
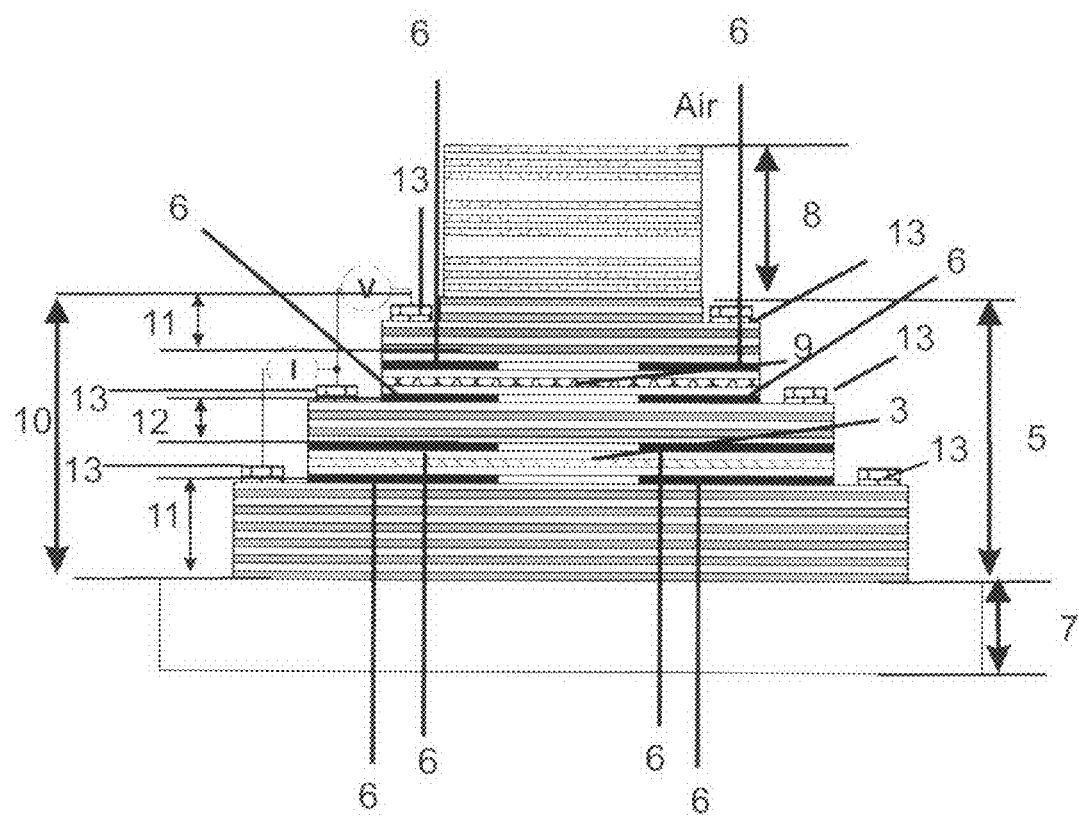
FIG. 9 shows an example of practical implementation of the light emitting device. Doped semiconductor Bragg reflector contains regions with gain medium and electro-optic medium, which have electric contacts. Forward bias is applied to the gain section resulting in forward current (I). Reverse modulated bias is applied to the electro-optic section. Only one (the bottom cavity mode) of the two coupled vertical modes will be predominantly amplified as the quality factor of the top cavity is relatively lower. The active mode can be tuned by using the voltage applied to the modulator section causing the refractive index change both in wavelength and (or) in intensity.

An example of practical design of such a light emitting device is given in FIG. 9. Doped semiconductor Bragg reflector (10) with n-doped (11) and p-doped (12) regions (or vice versa) contains regions with gain medium (3) and electro-optic medium (9), which have electric contacts (13). Forward bias is applied to the gain section resulting in forward current (I). Reverse modulated bias (V) is applied to the electro-optic section. Two vertical cavity modes can be angle-selectively amplified by the device. However, the bottom cavity mode of the two coupled vertical modes can be predominantly amplified, if the quality factor of the top cavity is relatively lower, for example due to the lack of the semiconductor DBR. The active mode can be tuned by using the voltage applied to the modulator section causing the refractive index change both in wavelength and (or) in intensity. In the other case the bottom DBR provides a lower quality factor for the bottom cavity mode, while the top dielectric DBR ensures a higher finesse of the top dielectric cavity. In this case the optical mode will be generated predominately in the top optical cavity and will be emitted towards the substrate of the device structure.

The devices described may include heavily doped contact layers, metal contacts, contain means of injection of nonequilibrium carriers by current injection, electron beam excitation or photoexcitation, as it is well described in literature for conventional light-generating or light-amplifying devices.

The devices described may be additionally attached to semiconductor, metal or dielectric layers or multilayer structures, for example to high-finesse optical cavities, coupled cavities or multilayer Bragg reflectors, provide means of exciting of the optical cavity modes for multiple reasons. However, unless the conditions of the present invention of angle-selective amplification are fulfilled, the improved directionality of the optical emission will follow. Different types of devices including light-emitting diodes, laser diodes, and cascade lasers can be utilized in this approach and provide improved directionality of the beam due to the angle selection. For multilayer reflectors the Bragg condition is even not obligatory, and the multilayer interference reflectors may contain non-periodic regions or the periodicity may be intentionally disturbed, while the functionality will still be maintained unless the angle-selective amplification takes place in the reflector region.

The device combined with these additional structures may act as angle-selective wavelength tunable light-emitting source, double-wavelength light emitting light source, for example, also as a light source for double wavelength emission with tuning of the wavelength spacing, for example for generation of terahertz radiation. Photoelectrons can be generated with tunable terahertz radiation under photoexcitation using the device. Different frequency conversion schemes applying external cavities with non-linear crystals can be applied using angle-selective generation or amplification of optical, UV or terahertz radiation in the described device.

The surfaces or interfaces of the device may contain different metal or dielectric patterns like photonic crystals, or metal plasmonic structures, magnetic layers and patterns. Different substrates and materials can be applied for epitaxial growth or vapor or vacuum deposition. For example, but not limited to (Al, Ga, In) (As, P, Sb, N) alloys or binary materials can be used, for example being epitaxially grown on GaAs or InP substrates using molecular beam epitaxy or metal-organic chemical vapor deposition. Multilayers made of (In, Ga, Al)N materials on GaN, sapphire or silicon substrates can be applied for growth of devices in the UV-green spectral range.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which are embodied within a scope encompassed and equivalents thereof with respect to the features set out in the appended claims. Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A device which is composed of:
    (a) a reflector providing at least one reflectivity stopband,
    (b) a gain region with means for generating optical gain introduced into said reflector, said gain region having a gain spectrum overlapping with the spectral range of the reflectivity stopband,
    (c) a medium attached to said reflector, and
    (d) an interface between said reflector and said medium, wherein optical emission impinging to the reflector from said medium partially penetrates into the reflector, and wherein the reflectivity of the reflector for a light with a wavelength within the reflectivity stopband is an increasing function of a tilt angle between a propagating direction of the light within said medium and a direction normal to said interface, such that, among a photon propagating within said medium at a first tilt angle and a photon propagating in said medium at a second tilt angle, wherein said second angle is larger than said first angle, amplification of said photon propagating at said first angle by said gain region is stronger than amplification of said photon propagating at said second angle.

2. The device of claim 1 wherein the reflector is chosen from a group consisting of:
    (a) multilayer interference reflector,
    (b) evanescent reflector, or
    (c) a combination of a multilayer interference reflector and an evanescent reflector.

3. The device of claim 1, wherein the gain region is chosen from a group consisting of:
    (a) bulk material,
    (b) quantum well material,
    (c) quantum wire material, or
    (d) quantum dot material.

4. The device of claim 1 wherein the the medium is selected from a group consisting of:
    (a) bulk medium,
    (b) multilayer medium, or
    (c) three-dimensionally patterned medium.

5. The device of claim 4, wherein the materials of the medium are chosen from a group consisting of:
    (a) dielectric materials,
    (b) metals, or
    (c) semiconductor materials.

6. The device of claim 5, wherein the medium comprises a group consisting of:
    (a) one or more multilayer interference reflector,
    (b) one or more high-finesse optical cavities confined by interference reflectors, or
    (c) one or more optical cavities confined by evanescent reflectors.

7. The device of claim 1, wherein the reflector further comprises a section with a medium providing an electro-optic effect by a means selected from the group of means including:
    (a) application of voltage to said section via Stark, Quantum-Confined Stark or Franz-Keldysh effects,
    (b) application of current to said section resulting in electron-hole plasma-induced electro-optic effect, or
    (c) a combination of (a) and (b).

8. The device of claim 1 acting as a device chosen from a group consisting of:
    (a) an optical amplifier for a transmitted light,
    (b) an optical amplifier for a reflected light,
    (c) a light emitting diode,
    (d) a superluminescent light emitting diode,
    (e) an edge emitting laser,
    (f) a tilted wave laser,
    (g) a tilted cavity laser,
    (h) a laser with evanescent light outcoupling,
    (i) a vertical cavity surface emitting laser, or
    (k) a microdisc laser.

9. The device of claim 7, which provides a tuning of the light wavelength by an electro-optic modulation of the refractive index in the reflector region.

10. The device of claim 9, which includes two or more optical cavities, multilayer reflectors, or evanescent reflectors, wherein an interaction of optical modes is changed by a change of the refractive index in the reflector section.

11. The device of claim 10 wherein applying of the electro-optical effect in the reflector section results in tuning of the light wavelength of the device.

12. The device of claim 10 wherein applying of electro-optical effect in the reflector section results in tuning of a light intensity of the device.

13. The device of claim 1, which contains means of gain generation by current injection or photo-excitation.

14. The device of claim 1, further comprising lateral current aperture regions confining current and/or electro-optic effect.

15. The device of claim 14, wherein the lateral aperture regions is are produced by a means selected from a group of means including:
   (a) selective oxidation of specially introduced Al-rich layers,
   (b) selective etching off a specially introduced layer with an enhanced etching rate for an etchant used, or
   (c) a combination of (a) and (b).

* * * * *

UNITED STATES PATENT AND TRADEMARK OFFICE
CERTIFICATE OF CORRECTION

| | | |
|---|---|---|
| PATENT NO. | : 8,472,496 B2 | Page 1 of 1 |
| APPLICATION NO. | : 12/803747 | |
| DATED | : June 25, 2013 | |
| INVENTOR(S) | : Nikolay Ledentsov | |

It is certified that error appears in the above-identified patent and that said Letters Patent is hereby corrected as shown below:

Title Page, Item (73) Assignee should read

-- Nikolay Ledentstov, Gasteiner Str. 7, Berlin 10717 (DE) --

Signed and Sealed this
Twenty-second Day of April, 2014

Michelle K. Lee
*Deputy Director of the United States Patent and Trademark Office*